United States Patent
Wang

(10) Patent No.: US 11,146,214 B2
(45) Date of Patent: Oct. 12, 2021

(54) MULTI-CHANNEL DOHERTY AMPLIFIER, MULTI-ANTENNA TRANSMITTER, AND METHOD FOR TURNING ON THE MULTI-CHANNEL DOHERTY AMPLIFIER

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 111 days.

(21) Appl. No.: 16/493,339

(22) PCT Filed: Apr. 27, 2017

(86) PCT No.: PCT/CN2017/082139
§ 371 (c)(1),
(2) Date: Sep. 12, 2019

(87) PCT Pub. No.: WO2018/195843
PCT Pub. Date: Nov. 1, 2018

(65) Prior Publication Data
US 2021/0143778 A1 May 13, 2021

(51) Int. Cl.
*H03F 1/02* (2006.01)
*H03F 1/56* (2006.01)
(Continued)

(52) U.S. Cl.
CPC .......... *H03F 1/0288* (2013.01); *H03F 1/56* (2013.01); *H03F 3/195* (2013.01); *H03F 3/245* (2013.01);
(Continued)

(58) Field of Classification Search
CPC .......... H03F 1/0288; H03F 1/56; H03F 3/195; H03F 3/245; H03F 3/68; H03F 2200/192; H03F 2200/451; H04B 7/0413
(Continued)

(56) References Cited

U.S. PATENT DOCUMENTS

2008/0036533 A1* 2/2008 Lim .................. H03F 3/68
330/124 R
2011/0279178 A1 11/2011 Outaleb et al.
(Continued)

FOREIGN PATENT DOCUMENTS

CN 102427332 A 4/2012
EP 1 887 686 A1 2/2008
(Continued)

OTHER PUBLICATIONS

Anaren_Design_Considerations_for_Surface_Mount_Couplers_Application_Notes, published in 2011 (Year: 2011).*
(Continued)

*Primary Examiner* — Hafizur Rahman
(74) *Attorney, Agent, or Firm* — Sage Patent Group

(57) ABSTRACT

Embodiments of the disclosure generally relate to a multi-channel Doherty power amplifier, a multi-antenna transmitter, and a method for turning on the multi-channel Doherty amplifier. The multi-channel Doherty power amplifier includes: multiple input ports and the same number of output ports corresponding to multiple channels, the multiple channels having the same characteristics for radio signal amplification and transmission; multiple private peaking amplifiers corresponding to the multiple channels; and a common Doherty core shared by the multiple private peaking amplifiers. The multiple private peaking amplifiers and the common Doherty core are configured to amplify identical multi-channel signal for multiple inputs and multiple outputs, thus (Continued)

higher saving ratio and better channel performance (output power, linearity, efficiency, power gain etc.) consistency would be greatly improved.

14 Claims, 11 Drawing Sheets

(51) Int. Cl.
    *H03F 3/195*     (2006.01)
    *H03F 3/24*     (2006.01)
    *H03F 3/68*     (2006.01)
    *H04B 7/0413*     (2017.01)

(52) U.S. Cl.
    CPC ............. *H03F 3/68* (2013.01); *H04B 7/0413* (2013.01); *H03F 2200/192* (2013.01); *H03F 2200/451* (2013.01)

(58) Field of Classification Search
    USPC ........................................................ 330/124
    See application file for complete search history.

(56) References Cited

U.S. PATENT DOCUMENTS

| | | |
|---|---|---|
| 2012/0154034 A1 | 6/2012 | Kato et al. |
| 2013/0099866 A1 | 4/2013 | Conradi |
| 2013/0181773 A1 | 7/2013 | Liu |
| 2014/0306765 A1 | 10/2014 | Zhang et al. |

FOREIGN PATENT DOCUMENTS

| | | |
|---|---|---|
| EP | 2 159 912 A1 | 3/2010 |
| EP | 2728741 A1 | 5/2014 |
| WO | WO 2006/068546 A1 | 6/2006 |
| WO | WO 2011/024281 A1 | 3/2011 |
| WO | WO 2016/077257 A1 | 5/2016 |

OTHER PUBLICATIONS

International Search Report and Written Opinion of the International Searching Authority, PCT/CN2017/082139, dated Feb. 2, 2018, 11 pages.

Shichang Chen et al., Compact Doherty Power Amplifier Design for 2 × 2 Multiple-Input Multiple-Output System, IEEE Microwave and Wireless Components Letters, vol. 26, No. 3, Mar. 2016, pp. 216-218.

Extended European Search Report for European Application No. 17907959.5 dated Oct. 8, 2020, 9 pages.

Darraji Ramzi et al., "Wideband Two-Section Impedance Transformer With Flat Real-to-Real Impedance Matching", IEEE Microwave and Wireless Components Letters, IEEE Service Center, New York, NY, US, vol. 26, No. 5, May 6, 2016 (May 6, 2016), pp. 313-315, XP011611802.

\* cited by examiner

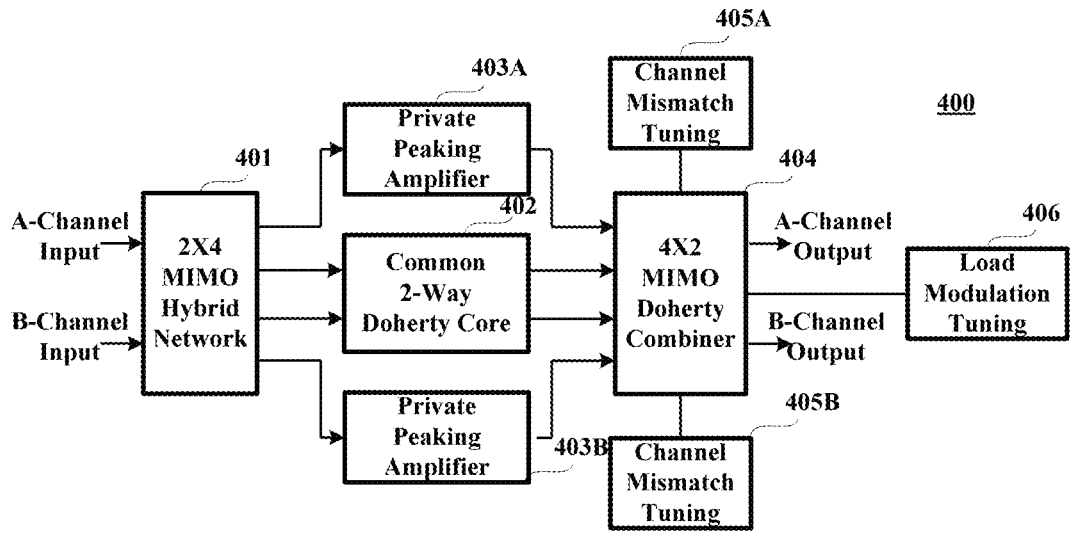
Fig. 4
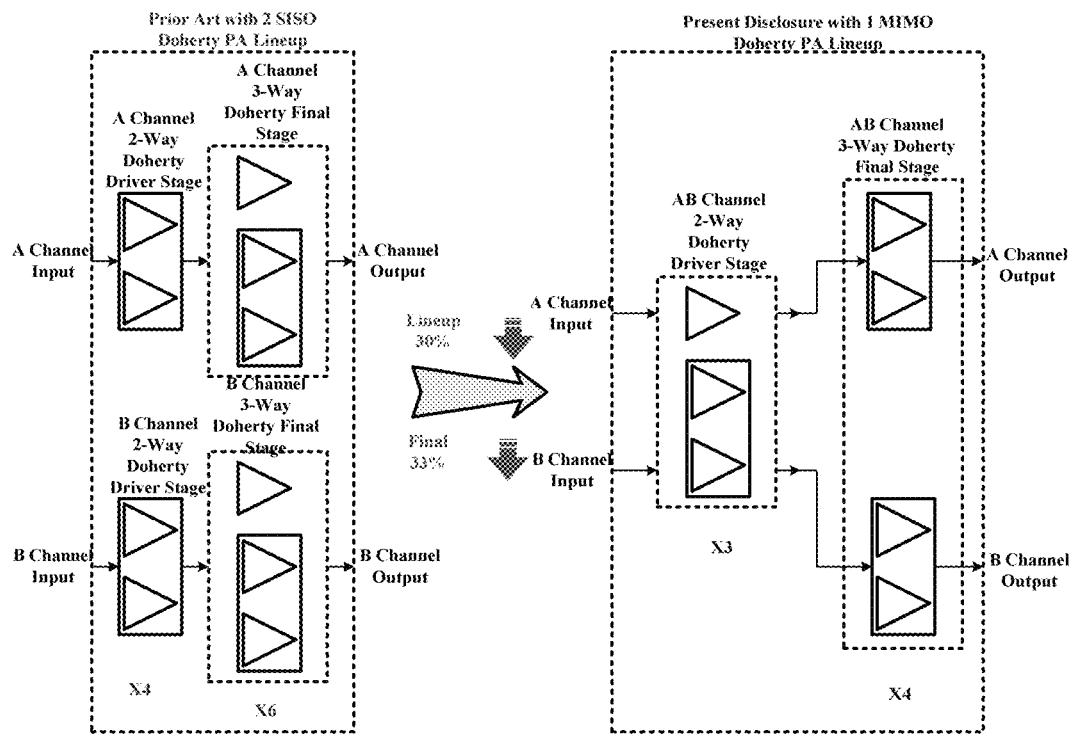
(a)

(b)

1400

1401
the common carrier amplifier is turned on until an input power level reaches a predetermined threshold 1402
the multiple private peaking amplifiers are turned on in a proper sequence until all the private peaking amplifiers are on 1403
the at least one common peaking amplifier is turned on in a proper sequence until all the common peaking amplifier are on

MULTI-CHANNEL DOHERTY AMPLIFIER, MULTI-ANTENNA TRANSMITTER, AND METHOD FOR TURNING ON THE MULTI-CHANNEL DOHERTY AMPLIFIER

This application is a 35 U.S.C. § 371 national stage application of PCT International Application No. PCT/CN2017/082139 filed on Apr. 27, 2017, the disclosure and content of which is incorporated by reference herein in its entirety.

TECHNICAL FIELD

Embodiments of the present disclosure generally relate to the field of communications, and more particularly, to a multi-channel Doherty amplifier, a multi-antenna transmitter, and a method for turning on the multi-channel Doherty amplifier.

BACKGROUND

In cellular base stations of 4G and beyond, advanced digital modulation scheme is used for high spectrum efficiency. The radio frequency (RF) signal exhibits a large peak to average power ratio (PAPR), which is amplified simultaneously in a power amplifier (PA). Therefore, the instantaneous transmitted power will vary very extensively and fast.

The Doherty PA is used to enhance efficiency for high PAPR signal. However, with ever increasing PAPR, the main difficulties in a Doherty PA is limited Doherty region to maintain high efficiency with signal PAPR greater than 6 dB.

Multiple-Input Multiple-Output (MIMO) is a multiple antenna technique offers high potential for increasing information throughput for 5G system, besides from using complex modulation schemes. MIMO represents a powerful technique for enhancing channel capacity due to the diversity gain, while its performance is highly related to the RF hardware. It had been proved as a good way to improve wireless connectivity, as it can counteract multi-path fading by using spatial diversity, but the use of multiple antennas would increase system size and complexity. MIMO transmitter requires at least TWO paths, which requires a complete new design perspective from each part of the system. For example, a traditional RF PA design may be less cost effective because it treats each PA design for path as a separated individual design. A conventional Doherty PA includes multiple amplifier units for single transmitter path.

For instance, for one single transmitter path, a 2-way Doherty PA requires TWO amplifier cells while a 3-way Doherty PA requires THREE amplifier cells. This means all prior arts in this traditional form are using single input single output (SISO) concept, even for existing multiple input multiple output (MIMO) transmitter system. However, the SISO Doherty PAs brought about many disadvantages when they were used for MIMO transmitter system. A typical MIMO transmitter requires at least TWO transmitter paths, known as 2×2 MIMO. In traditional concept, it requires at least FOUR amplifier cells and SIX amplifier cells for 2-way Doherty PA and 3-way Doherty PA respectively for 2×2 MIMO.

This section introduces aspects that may facilitate a better understanding of the disclosure. Accordingly, the statements of this section are to be read in this light and are not to be understood as admissions about what is in the prior art or what is not in the prior art.

SUMMARY

The inventor found that the shortcomings are bulky MIMO PA design, poor channel performance consistency, high printed circuit board (PCB) consuming, high cost and high potential manufacture failure rate (MFR) when more and more amplifiers are used for single transmitter path. Therefore, this phenomenon is a DEFECT for existing MIMO transmitter design for 4G and coming 5G. In 5G, the massive MIMO concept would be highly appreciated. Massive transmitter path for signal with traditional SISO Doherty PA design concept would cause serious design issue when 16, 64, 128 and more transmitter paths are employed.

To solve at least part of the above problems, a multi-channel Doherty amplifier, a multi-antenna transmitter, and a method for turning on the multi-channel Doherty amplifier are provided in the present disclosure. It can be appreciated that embodiments of the present disclosure are not limited to a MIMO transmitter system, but could be more widely applied to any application scenario where similar problems exist.

Various embodiments of the present disclosure mainly aim at providing a multi-channel Doherty power amplifier, a multi-antenna transmitter and a method for turning on the multi-channel Doherty power amplifier, for example, in a MIMO transmitter system. The transmitter could be, for example, a terminal device or a network device. Other features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a concept of novel MIMO Doherty PA to overcome the problems pointed out above.

In a first aspect, a multi-channel Doherty power amplifier is provided. The multi-channel Doherty power amplifier includes: multiple input ports and the same number of output ports corresponding to multiple channels, the multiple channels having the same characteristics for radio signal amplification and transmission; multiple private peaking amplifiers corresponding to the multiple channels; and a common Doherty core shared by the multiple private peaking amplifiers; wherein, the multiple private peaking amplifiers and the common Doherty core are configured to amplify identical multi-channel signal for multiple inputs and multiple outputs.

In one embodiment, the common Doherty core comprises one common carrier amplifier and at least one common peaking amplifier.

In one embodiment, the common carrier amplifier and the at least one common peaking amplifier are connected in parallel, and the turning on of the private peaking amplifiers is earlier than that of the at least one common peaking amplifier.

In one embodiment, the common carrier amplifier and the at least one common peaking amplifier are connected in serial, and the turning on of the private peaking amplifiers is later than that of the at least one common peaking amplifier.

In one embodiment, the multi-channel Doherty power amplifier further includes: a power divider, configured to split input signals of the multiple channels into input signals of the multiple private peaking amplifiers and the common Doherty core.

In one embodiment, the power divider comprises at least two quadrature hybrid couplers, and they are symmetrical structure for the multi-channel signal splitting.

In one embodiment, the multi-channel Doherty power amplifier further includes: a Doherty combiner, configured to combine output signals of the multiple private peaking amplifiers and the common Doherty core and output signals corresponding to the multiple channels.

In one embodiment, the Doherty combiner includes: a multistage Doherty combiner, configured to combine output signals of the common Doherty core; a splitting node, configured to split the combined output signal and output signals corresponding to the multiple channels symmetrically, multiple channel summing nodes, configured to sum respectively combined output signal corresponding to each channel and output signal feeding forward by the splitting node; and multiple real-to-real impedance transformers, configured to terminate respectively load for each channel and output signal corresponding to each channel.

In another embodiment, the Doherty combiner further includes: multiple channel peaking combiners, configured to combine signals output from multiple private peaking amplifiers.

In one embodiment, the multi-channel Doherty power amplifier further includes: multiple channel mismatch tuners corresponding to the multiple private peaking amplifiers, configured to compensate mismatch among the multiple channels.

In one embodiment, the multi-channel Doherty power amplifier further includes: a load modulation tuner, configured to adjust the load modulation behavior by influencing the impedance value of the common node.

In one embodiment, the topology of the common Doherty core comprises any one of the following: normal Doherty, inverted Doherty, even Doherty, uneven Doherty, symmetric Doherty, asymmetric Doherty, parallel type Doherty, serial type Doherty, multistage Doherty, or multi-way Doherty.

In a second aspect, a method for turning on a multi-channel Doherty power amplifier is provided. The multi-channel Doherty power amplifier comprises multiple private peaking amplifiers and a common Doherty core, the common Doherty core comprises one common carrier amplifier and at least one common peaking amplifier. The method including: turning on the common carrier amplifier until an input power level reaches a predetermined threshold; turning on the multiple private peaking amplifiers in a proper sequence until all the private peaking amplifiers are on; and turning on the at least one common peaking amplifier in a proper sequence until all the common peaking amplifier are on.

In a third aspect, a multi-antenna transmitter is provided. The multi-antenna transmitter includes a signal processor, configured to perform signal processing on base band input signals of multiple channels; and a multi-channel Doherty power amplifier as described in the first aspect.

In one embodiment, the multi-channel Doherty power amplifier comprises multiple two-stage Doherty power amplifier, each two-stage Doherty power amplifier comprises two private peaking amplifiers and a common Doherty core, the common Doherty core comprises one common carrier amplifier and one common peaking amplifier.

In a fourth aspect, a computer program product is provided. The computer program product is tangibly stored on a computer readable storage medium and comprising instructions which, when executed on a processor of a multi-antenna transmitter, cause the multi-antenna transmitter to perform a method for turning on a multi-channel Doherty power amplifier as described in the second aspect.

According to various embodiments of the present disclosure, higher saving ratio (e.g. area, cost, component count etc.) and better channel performance (output power, linearity, efficiency, power gain etc.) consistency would be greatly improved.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which:

FIG. 4 shows an embodiment of the present disclosure for 2×2 MIMO Doherty PA;

DETAILED DESCRIPTION

Figure 1:
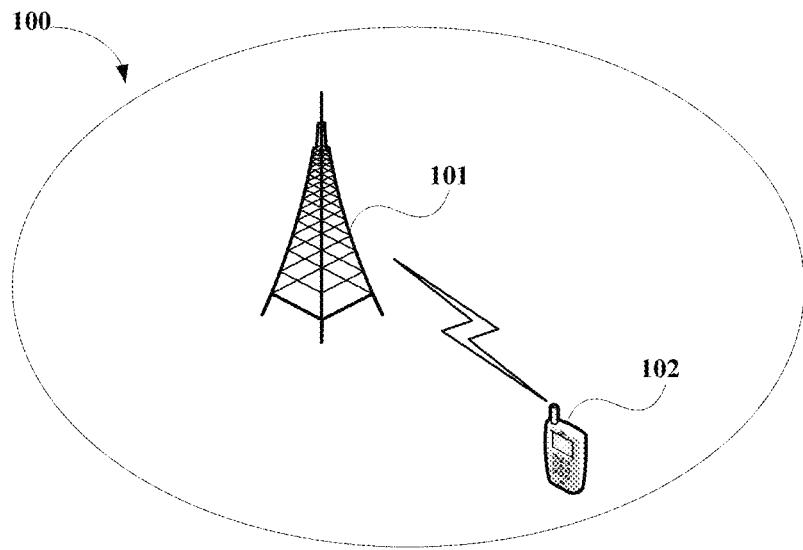
FIG. 1 shows a schematic diagram 100 of a cell of wireless communication network.

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), a server, a controller or any other suitable device in the wireless communication network. The BS may be, for example, a node B (NodeB or NB), an evolved NodeB (eNodeB or eNB), a gNode B (gNB), a relay, a low power node such as a femto, a pico, and so forth.

Yet further examples of network device include multi-standard radio (MSR) radio equipment such as MSR BSs, base transceiver stations (BTSs), transmission points, transmission nodes. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, user equipment (UE), or other suitable device. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

The terminal device may support device-to-device (D2D) communication, for example by implementing a 3GPP standard for sidelink communication, and may in this case be referred to as a D2D communication device.

As yet another specific example, in an Internet of Things (IoT) scenario, a terminal device may represent a machine or other device that performs monitoring and/or measurements, and transmits the results of such monitoring and/or measurements to another terminal device and/or a network equipment. The terminal device may in this case be a machine-to-machine (M2M) device, which may in a 3GPP context be referred to as a machine-type communication (MTC) device.

As one particular example, the terminal device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearable computing device such as watches etc. In other scenarios, a terminal device may represent a vehicle or other equipment that is capable of monitoring and/or reporting on its operational status or other functions associated with its operation.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures. Reference is first made to FIG. 1, which shows a schematic diagram 100 of a wireless communication network. There illustrates a network device 101 and a terminal device 102 in the wireless communication network. In the example of FIG. 1, the network device 101 serves for the terminal device 102. The traffic between the network device 101 and the terminal device 102 may be URLLC traffic, eMBB traffic, mMTC traffic, and so on.

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations.

For convenience, in the following embodiments, descriptions are given taking MIMO system as an example, but the embodiments are not limited thereto, any systems related on multi-channel power amplifier such as satellite system etc., are all feasible in the present disclosure.

Figure 2:
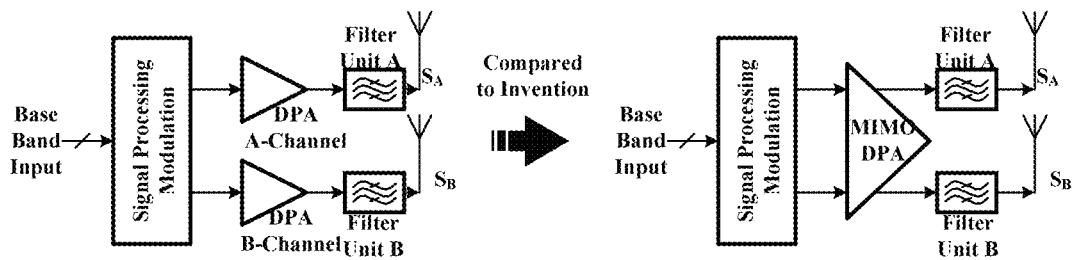
FIG. 2 shows schematic comparisons between SISO Doherty PA and MIMO Doherty PA for 2×2 MIMO transmitters.

FIG. 2 is schematic comparisons between SISO Doherty PA and MIMO Doherty PA for 2×2 MIMO transmitters, the generic MIMO Doherty PA concept was introduced in FIG. 2. As shown on left of FIG. 2, two separated Doherty PAs are needed as each transmitter path configuration. To reduce circuit dimension and cost, a MIMO Doherty structure was investigated in a prior art, as shown on right of FIG. 2. To be specific, identical RF signals are distributed into three sub-amplifiers using two Wilkinson dividers and a T-junction combiner. One single carrier amplifier and two peaking amplifiers are arranged to operate sequentially with the increase of the input power. The load modulation mechanism of the proposed single-carrier twin-peaking structure is much similar to that of a conventional Doherty PA.

However, the prior art had limited performance and cost/PCB area saving. For example, although a 25% transistor number saving for 2×2 MIMO configuration and accordingly BOM cost saving is achieved, more saving is highly demanded. For another example, only a limited 6 dB output power back off range for Doherty operation is supported, 12 dB or more range is not possible for the prior art structure. For a further example, only single-ended carrier amplifier is arranged as common or sharing manner, the saving percentage is limited, even more private peaking amplifiers are used for multi-way structure, the component/cost saving is not promising and yield rate/channel mismatch would be degraded due to using more separated peaking cells. For still another example, the T-junction network used for combining the inputs of MIMO for carrier amplifier sharing is performance limited (limited Q value and power handling capability for high power) by lumped elements. However, the transmission line would be PCB area consuming and limited performance to realize the inductors. For still a further example, due to the carrier sharing half the power of carrier amplifier for each path, an asymmetric 2-way Doherty structure make obvious efficiency dropping between two peak efficiency points. The higher asymmetric level, the more serious of the efficiency dropping effect would happen. Therefore, the output power back off range for Doherty operation is limited. A range of greater than 12 dB is quite difficult to realize. For still another example, the prior art lacks of tuning elements to adjust the channel mismatch, which would be highly desired for a practical product design to provide flexible way to improve yield rate. Also, the prior art lacks of load modulation control element to adapt the common and private paths for MIMO Doherty behavior.

In order to solve at least one of the problems above, the present disclosure is proposed. The embodiments of this disclosure shall be described below with reference to the accompanying drawings and particular implementations.

A First Embodiment

A multi-channel Doherty power amplifier is provided in this embodiment. The multi-channel Doherty power amplifier is implemented in a transmitter, such as a multi-antenna transmitter at a terminal device or at a network device.

Figure 3:
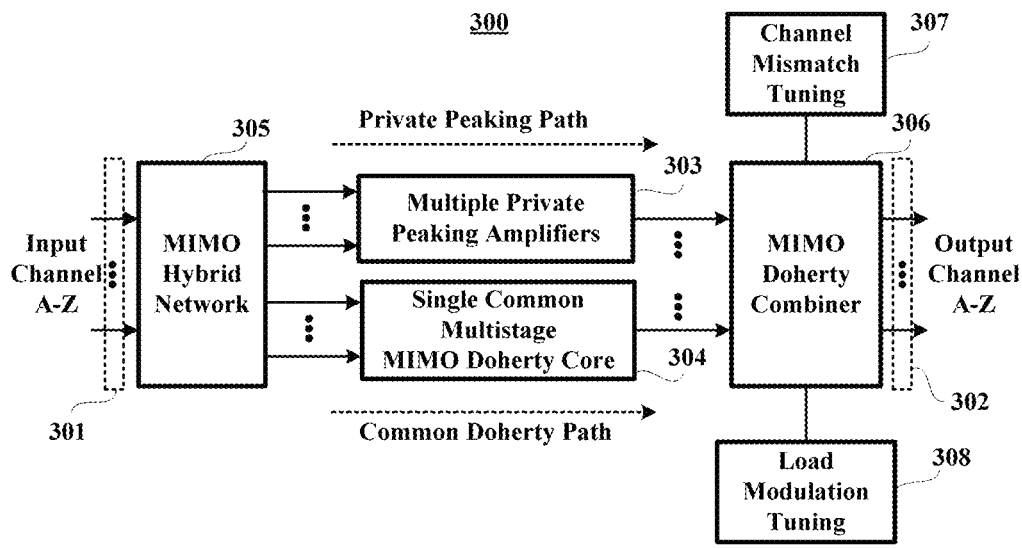
FIG. 3 shows a general block diagram of the present disclosure.

FIG. 3 illustrates a general block of the multi-channel Doherty power amplifier 300 of the present disclosure. As shown in FIG. 3, the multi-channel Doherty power amplifier 300 includes: multiple input ports 301 and the same number of output ports 302 corresponding to multiple channels, the multiple channels having the same characteristics for radio signal amplification and transmission; multiple private peaking amplifiers 303 corresponding to the multiple channels; and a common Doherty core 304, such as a single common multistage MIMO Doherty core, which is shared by the multiple private peaking amplifiers 303. In this embodiment, the multiple private peaking amplifiers 303 and the common Doherty core 304 are configured to amplify identical multi-channel signal for multiple inputs and multiple outputs.

With the embodiment of this disclosure, multiple private peaking amplifiers and a common Doherty core are arranged to provide MIMO feature. The common Doherty core is shared by the private peaking amplifiers. Therefore, an enhanced asymmetric multistage Doherty can be formed naturally for MIMO.

In an implementation of this embodiment, the common Doherty core 304 includes one common carrier amplifier and at least one common peaking amplifier (not shown in FIG. 3). By introducing an additional common peaking amplifier(s) together with a common carrier amplifier, a single common Doherty core, such as a single common multistage MIMO Doherty core is formed and shared by all the private peaking amplifiers. This is a great saving for transistor numbers. For example, with the simplest 2×2 MIMO, with the present disclosure, the prior art with 25% component saving would be increased to 33% and with higher performance.

In this implementation, the at least one common peaking amplifier is not operating with the carrier ordinal, the turning on sequence is different according to the specific topologies of used common Doherty core. For example, it may be turned on after or before the turning on of the private peaking amplifiers depending on the connection manner of the common carrier and the at least one common peaking amplifier.

In one implementation, the common carrier amplifier and the at least one common peaking amplifier are connected in parallel, then the turning on of the private peaking amplifiers is earlier than that of the at least one common peaking amplifier, which will be described below in detail in the second embodiment.

In another implementation, the common carrier amplifier and the at least one common peaking amplifier are connected in serial, then the turning on of the private peaking amplifiers is later than that of the at least one common peaking amplifier.

In this embodiment, as shown in FIG. 3, the multi-channel Doherty power amplifier 300 may further include a power divider 305, named as a MIMO hybrid network, which is configured to split/convert input signals of the multiple channels into input signals of the multiple private peaking amplifiers 303 and the common Doherty core 304. In this embodiment, the signals of the multiple channels are coming from the input ports 301, and they may be preprocessed by a signal processing modulation module as shown in FIG. 2, a processing manner is not limited in the present disclosure, which will not be described herein any further.

In an implementation, the power divider 305 includes at least two quadrature hybrid couplers (not shown in FIG. 3), and they are symmetrical structure for the multi-channel signal splitting. With this structure, component number may be reduced.

In this embodiment, as shown in FIG. 3, the multi-channel Doherty power amplifier 300 may further include a Doherty combiner 306, named as a MIMO Doherty combiner, which is configured to combine output signals of the multiple private peaking amplifiers 303 and the common Doherty core 304 and output signals corresponding to the multiple channels, such as feeding the signals forward to the output ports 302. With this structure, amplified signals may be combined and output to multiple output ports 302.

In an implementation, the Doherty combiner 306 includes a multistage Doherty combiner and a splitting node, which are not shown in FIG. 3, the multistage Doherty combiner is configured to combine output signals of the common Doherty core; the splitting node is configured to split the combined output signal and output signals corresponding to the multiple channels symmetrically.

In another implementation, the Doherty combiner 306 further includes multiple peaking combiners, multiple summing nodes, and multiple real-to-real impedance transformers, which are not shown in FIG. 3. In this implementation, the multiple peaking combiners, the multiple summing nodes, and the multiple real-to-real impedance transformers are correspond to the multiple channels, each of the summing nodes is configured to combine peaking values of signals amplified by each private peaking amplifier, each of the summing nodes is configured to sum combined output signal corresponding to each channel and output signal feeding forward by the splitting node, and each of the real-to-real impedance transformers is configured to terminate load for each channel and output signal corresponding to each channel.

In this embodiment, as shown in FIG. 3, the multi-channel Doherty power amplifier 300 may further include multiple channel mismatch tuners 307 corresponding to the multiple private peaking amplifiers 303, which is configured to compensate mismatch among the multiple channels. With this structure, flexibility for tuning multichannel signal consistency may be provided.

In this embodiment, as shown in FIG. 3, the multi-channel Doherty power amplifier 300 may further include a load modulation tuner 308, which is configured to adjust the load modulation behavior by influencing the impedance value of the common node. Similar with the channel mismatch tuners 307, the load modulation tuner 308 may also provide flexibility for tuning the active load modulation characteristic.

In order that the structure and the advantages of the multi-channel Doherty power amplifier can be easily understood, the multi-channel Doherty power amplifier is described below taking a 2×2 MIMO Doherty PA as an example.

FIG. 4 illustrates a basic form of the 2×2 MIMO Doherty PA 400, as shown in FIG. 4, the 2×2 MIMO Doherty PA 400 includes two input ports corresponding respectively to two channels as A-channel and B channel, a 2×4 MIMO hybrid network 401, a common 2-way Doherty core 402, two private peaking amplifiers as 403A and 403B, a 4×2 MIMO Doherty combiner 404, two channel mismatch tuning elements as 405A and 405B for 403A and 403B, and a load modulation tuning element 406. In this embodiment, the 2×4 MIMO hybrid network 401 converts 2 inputs into 4 inputs, the common 2-way Doherty core 402 includes a common carrier amplifier and a common peaking amplifier, the 4×2 MIMO Doherty combiner 404 sums up the inputs and generates two outputs.

In this embodiment, as described above, the biases for private peaking amplifiers 403A and 403B are higher than that of the common peaking amplifier in parallel type architecture, which will be described below in detail in the second embodiment.

Figure 5:
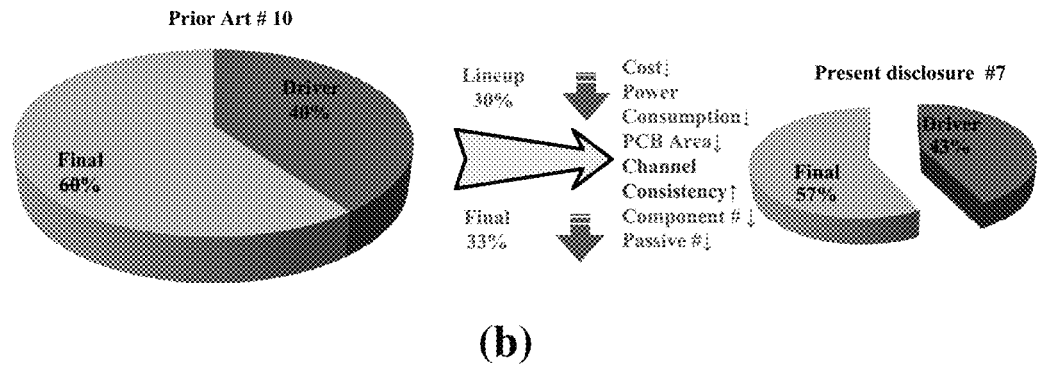
FIG. 5 shows an illustration of component saving and performance enhancement comparison with prior arts for a typical 2×2 MIMO Doherty PA line up, with at least 30% component count saving.

FIG. 5 illustrates component saving and performance enhancement comparison with prior art for a typical 2×2 MIMO Doherty PA line up, with at least 30% component count saving, wherein, (a) illustrates schematic comparison between prior art and the present disclosure; (b) illustrates pie charts comparison between component count reduction and others.

As shown in FIG. 5 (a), a traditional Doherty lineup includes driver stage and final stage. In the prior art, the driver stage employs a 2-way Doherty PA including two transistors and totally four for 2×2 MIMO, the final stage uses a 3-way Doherty PA including three transistors and totally six for 2×2 MIMO, therefore, the overall transistor count is TEN. In the present disclosure, the driver stage requires three transistors while the final stage only demands four transistors, resulting in a total component count of SEVEN. Therefore, for the overall line up 30% transistor count saving is achieved and 33% transistor count saving for final stage, which is much greater saving than the final stage saving of 25% in the prior art, without regarding the further average efficiency enhancement.

As shown in FIG. 5 (b), the pie charts comparison would give a clearer vision of this kind of saving. The present disclosure cuts decent bill of material (BOM) cost, power consumption, PCB area and component count which improve the MIMO channel performance consistency at the same time.

Figure 6:
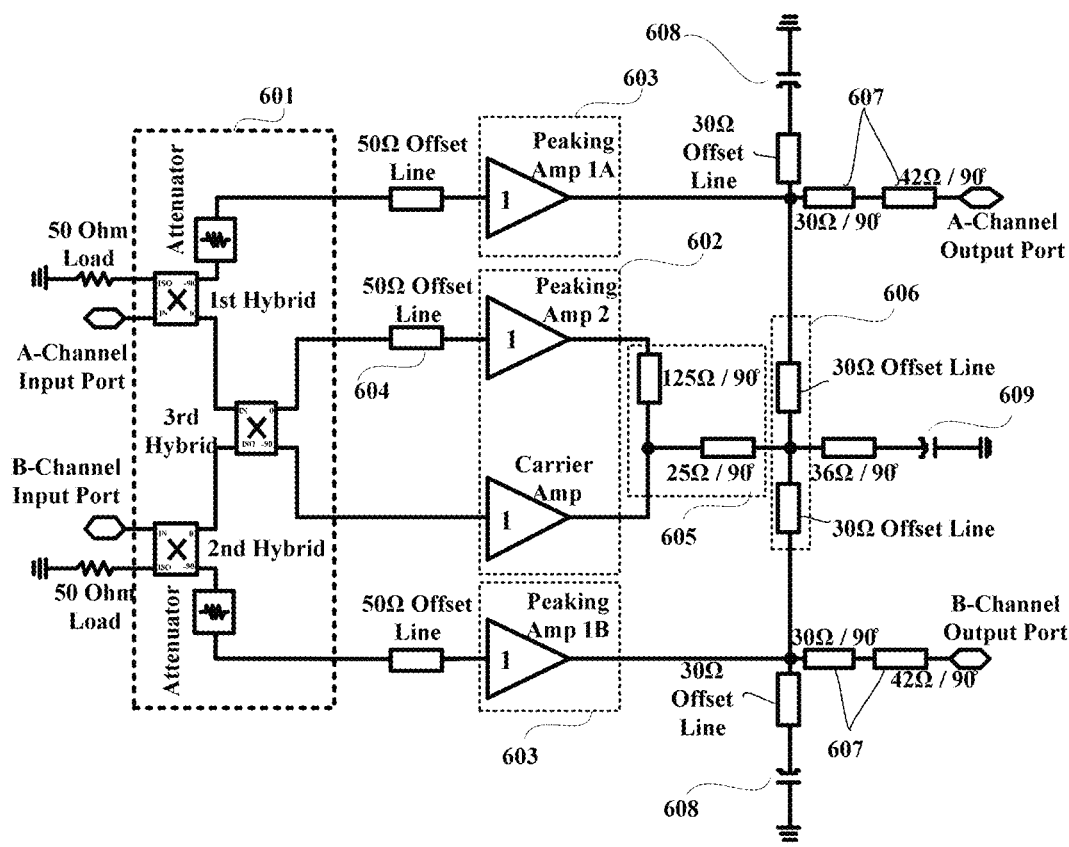
FIG. 6 shows an embodiment of the present disclosure for a typical 2×2 MIMO 3-way Doherty PA, with an inverted 2-way common Doherty core.

FIG. 6 illustrates an embodiment of the present disclosure for a 2×2 MIMO transmitter where a MIMO 3-way Doherty PA is adopted in the twin transmitters. As shown in FIG. 6, the input MIMO hybrid network 601 consists of three quadrature hybrid couplers with proper connections. It converts two inputs into four inputs and feeds the input signal into the common Doherty core 602 and the private peaking amplifiers 603 at the same time. The common Doherty core 602 looks like a 2-way inverted Doherty PA form. However, they are not operating in sequence order as described above. In the common peaking path, an input offset line 604 facilitates a proper active load modulation process. The common Doherty combiner 605 includes 125 ohm and 25 ohm quarter wavelength transmission lines. After the splitting branches of two 30 ohm offset lines 606, private peaking amplifiers 603 are incorporated with the common Doherty core 602 for a 3-way Doherty structure. Two real-to-real impedance transformers 607 are used to terminate 50 ohm load for each channel. Two channel mismatch tuning components 608 are used to compensate the MIMO channel mismatch caused by component variations and other factors. A load tuning element 609 is used to adjust the load modulation behavior by influencing the common node impedance value.

In the embodiment shown in FIG. 6, the common Doherty core 602 is an inverted Doherty, but the present invention does not limit the topology used for the common Doherty core 602. Normal Doherty, inverted Doherty, even Doherty, uneven Doherty, symmetric Doherty, asymmetric Doherty, parallel type Doherty, serial type Doherty, multistage Doherty and multi-way Doherty topologies are all feasible the technical implementation.

Figure 7:
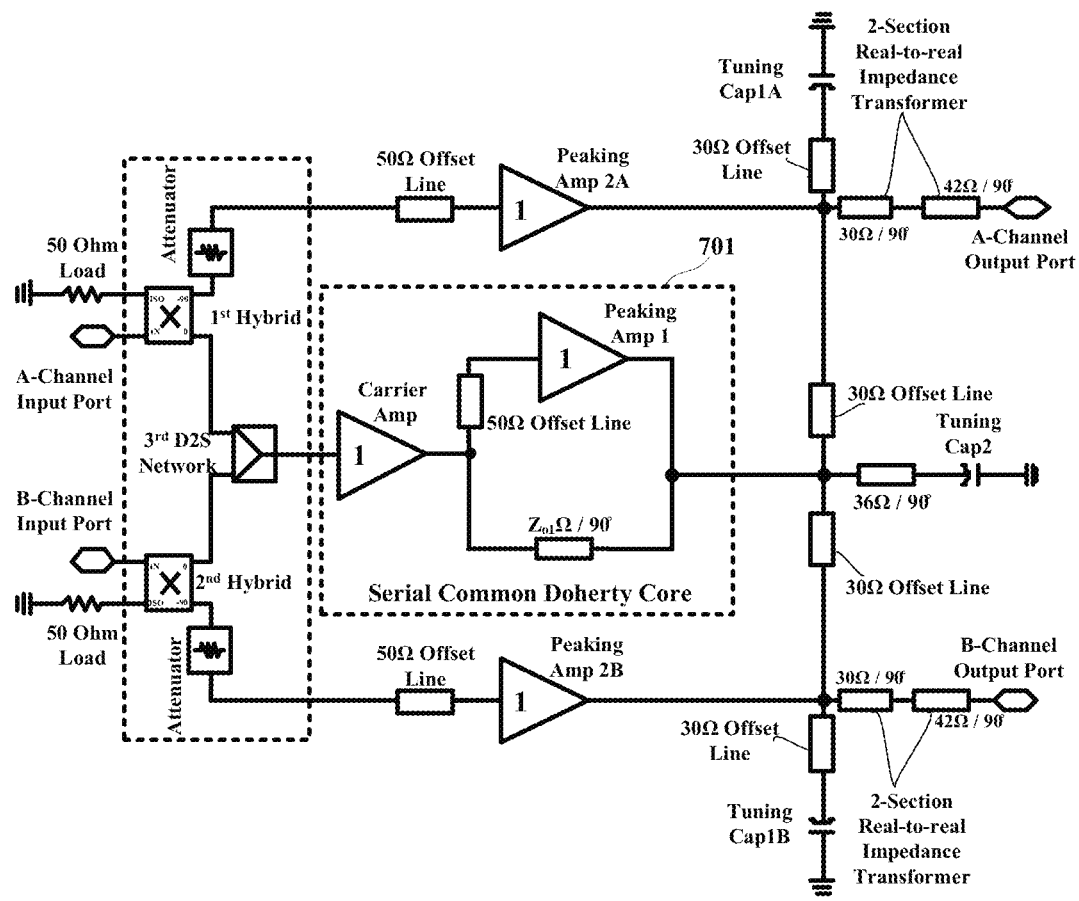
FIG. 7 shows an embodiment of the present disclosure for a typical 2×2 MIMO Doherty PA, with a serial type 2-way common Doherty core.

FIG. 7 illustrates a serial type common Doherty core 701. As shown in FIG. 7, compared to the prior art that employed multi-way serial type Doherty for large output power back off rang for Doherty region, the present disclosure uses a hybrid of both serial type and parallel type MIMO Doherty PA cells, thus, not only a high performance 3-way Doherty (>13.5 dB output power range for high efficiency operation) is realized, but also a MIMO Doherty structure for component saving is achieved. It should be noted that the biases for private peaking amplifiers are lower than that of the common peaking amplifier in serial type architecture, which is different from the settings from the parallel type MIMO Doherty PA.

Figure 8:
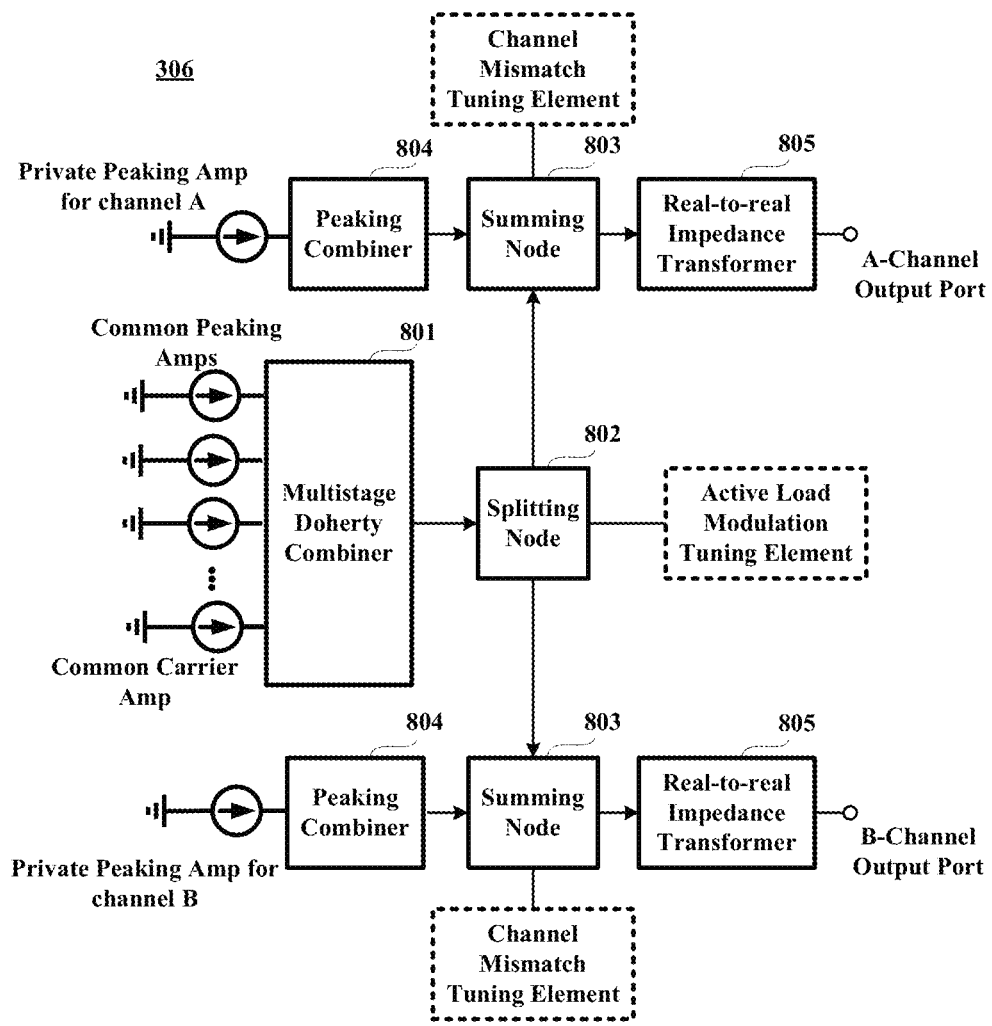
FIG. 8 shows a general block diagram of MIMO Doherty combiner proposed in the present disclosure.

FIG. 8 illustrates a generic form of the MIMO Doherty combiner 306 shown in FIG. 3 taking two channels (channel A and channel B, named as A-channel and B-channel) as an example, as shown in FIG. 8, the MIMO Doherty combiner 306 includes a multistage Doherty combiner 801, a splitting node 802, two summing nodes 803, two peaking combiners 804, and two real-to-real impedance transformers 805.

The structure of the MIMO Doherty combiner 306 shown in FIG. 8 is illustrated only, in another embodiment, the peaking combiners 804 for combining signals output from multiple private amplifiers is optional.

Figure 9:
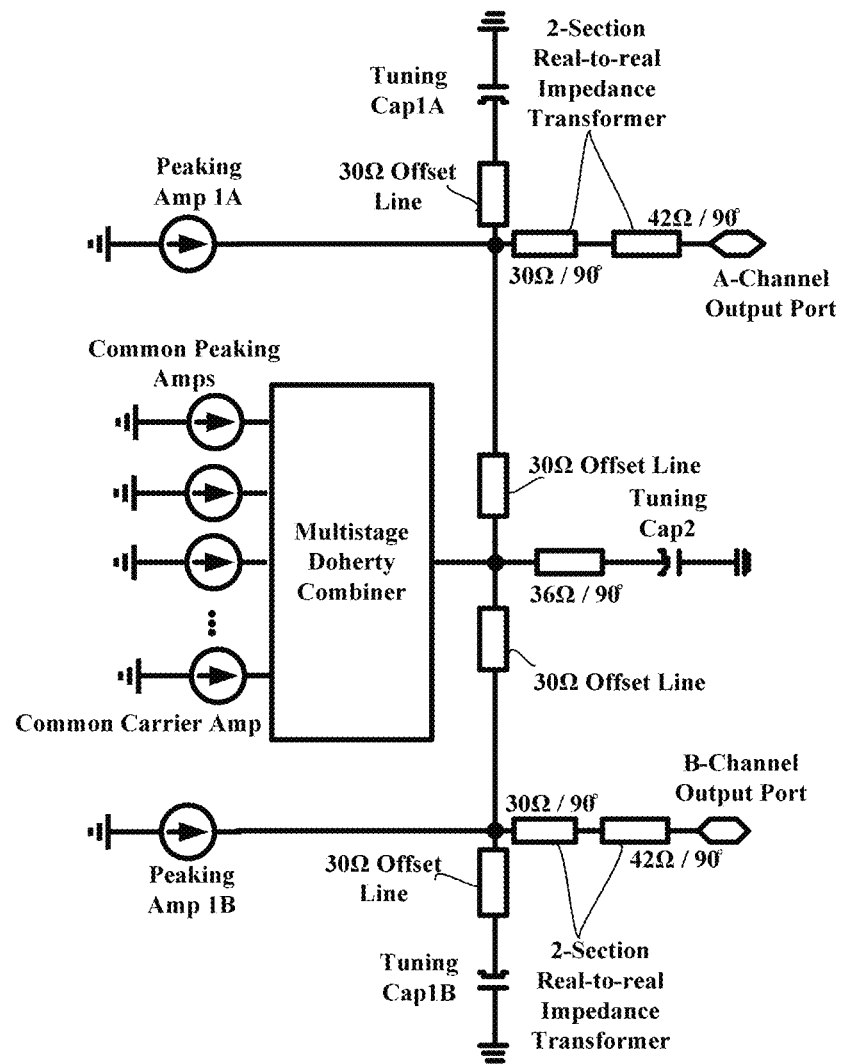
FIG. 9 shows an embodiment block diagram of 2×2 MIMO Doherty combiner proposed in the present disclosure for FIG. 7 and FIG. 8.

FIG. 9 illustrates the embodiment of proposed MIMO Doherty combiner for the embodiments of FIGS. 7 and 8.

Figure 10:
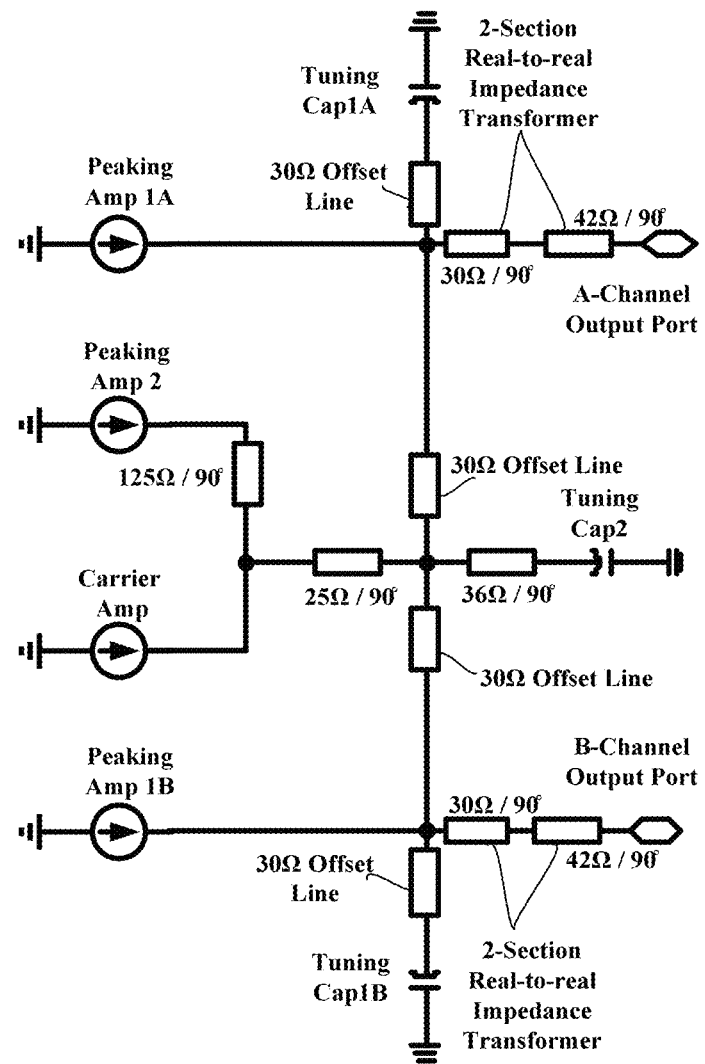
FIG. 10 shows an embodiment schematic of 2×2 MIMO Doherty combiner proposed in the present disclosure for FIG. 6.

FIG. 10 illustrates the schematic of proposed MIMO Doherty combiner for the embodiments of FIG. 6.

In this embodiment, with the design of FIG. 6, a simulation is performed to verify the concept.

Figure 11:
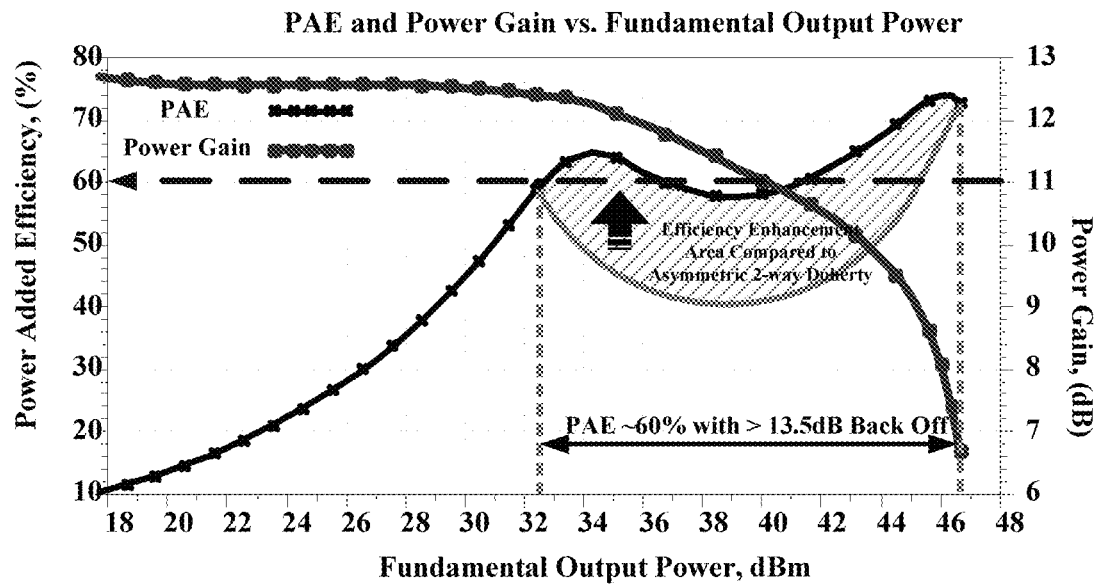
FIG. 11 shows the PAE and power gain versus fundamental output power with a technical implementation of FIG. 6.

FIG. 11 illustrates the power added efficiency (PAE), power gain versus fundamental output power curves. The power gain curve is smooth and rolling off slowly, which is excellent for digital pre-distortion (DPD) linearization. The PAE curve exhibit a very large (~13.5 dB) output back off range for Doherty operation without obvious efficiency dropping effects among peak efficiency points. This is much better than a traditional asymmetric Doherty with 12 dB output power backing off for Doherty region. As the size of the private peaking amplifier is larger than that of the common carrier amplifier, the problematic low driving capability caused by low biasing condition of the private peaking amplifiers is somewhat solved, leading to enlarged high-efficiency back-off range and minor efficiency dropping effect between two efficiency peak points.

Figure 12:
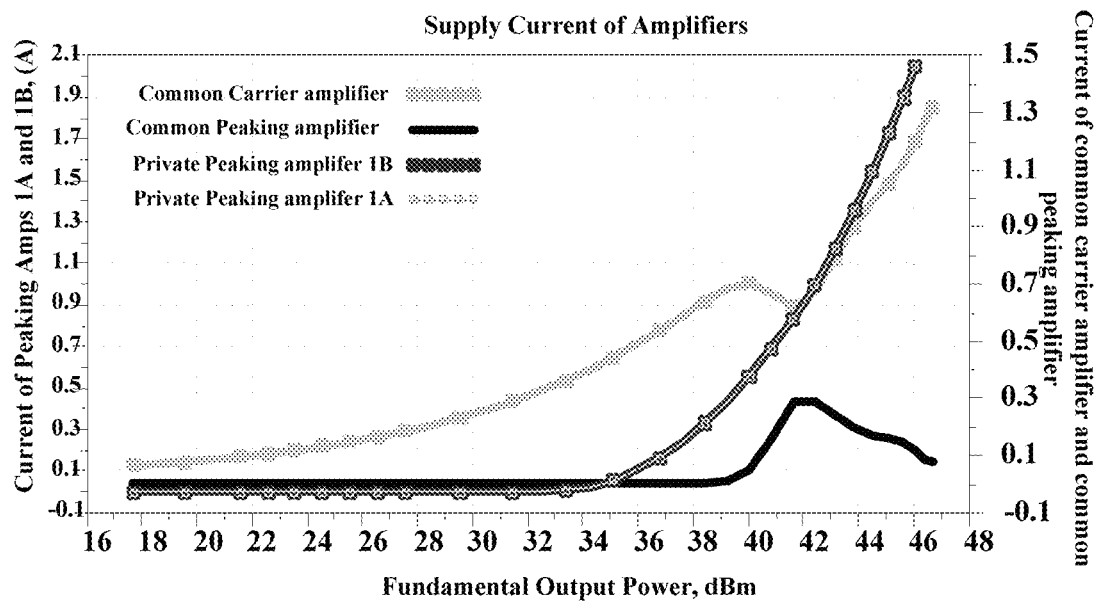
FIG. 12 shows common amplifiers current and private peaking amplifiers current unbalance performance between the two output terminals and sub-amplifier DC currents against fundamental output power with a technical implementation of FIG. 6.

FIG. 12 illustrates common peaking amplifier currents and private peaking amplifiers current unbalance between the two output terminals and sub-amplifier DC currents against fundamental output power with a technical implementation of FIG. 6. Because of the general structural symmetry, as shown in FIG. 12, there is almost no current unbalance between the two output terminals of the sub-amplifiers (1A and 1B) against the fundamental output power. The practical amplitude unbalance could be further compensated by tuning the Cap1 in each path in practice. For example, the small discrepancy may be caused by device variation or fabrication tolerance.

Figures 13, 14:
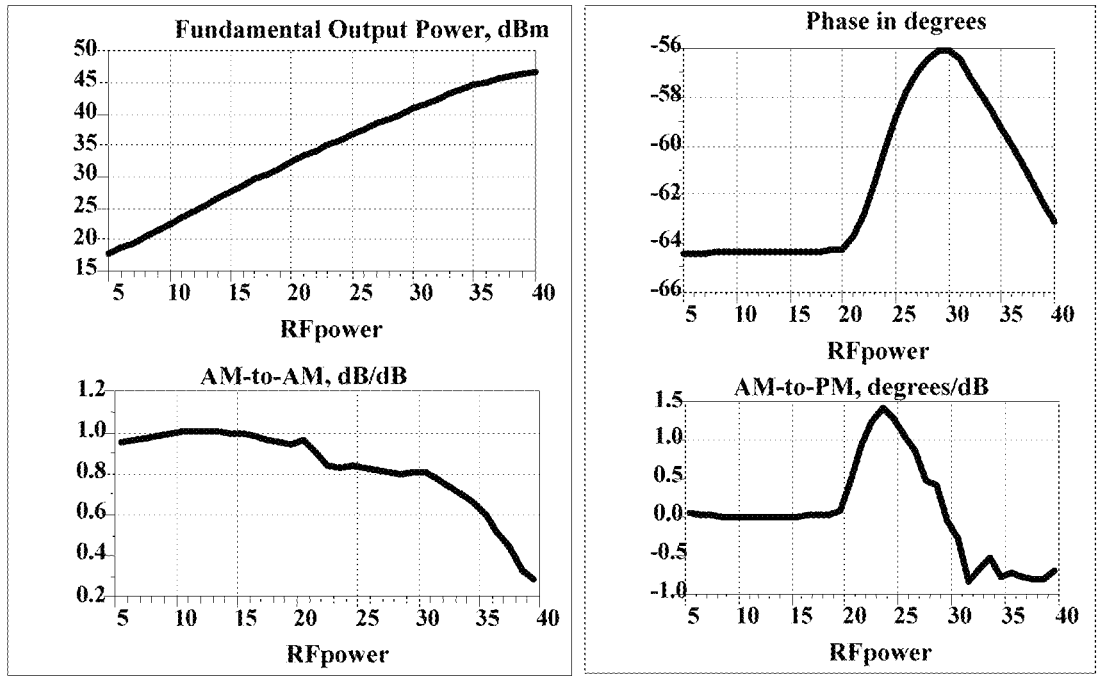
FIG. 13 shows fundamental output power versus RF power, AM-AM, AM-PM and phase in degrees with a technical implementation of FIG. 6.
FIG. 14 shows a diagram of a method for turning on a multi-channel Doherty power amplifier of the second embodiment of the present disclosure.

FIG. 13 illustrates the transfer function of fundamental output power versus RF power, AM-AM, AM-PM and phase in degrees of the technical implementation embodiment.

As can be seen from the above embodiment, a very compact MIMO Doherty PA architecture with large (~13.5 dB) Doherty region that supports two identical input and output signals was proposed, with at least 30% cost reduction and active component count reduction for equipment miniature and cost saving.

With the embodiment of the present disclosure, a compact design with fewer active components can be realized, and both bill of material (BOM) cost and PCB area could be reduced dramatically. For example, as shown in FIG. 5 of 2×2 MIMO transmitter, compared to the traditional Doherty line up which requires totally 10 RF power transistors, the present disclosure could realize the design with only 7 RF power transistors, which greatly reduces the overall circuit size and cost. However, the MIMO channel performance consistency would be increased because the common Doherty path is shared by private peaking path so that high consistency of performance could be granted and even for better yield rate during mass production phase.

Furthermore, to validate the effectiveness of present disclosure, an exemplary 2×2 MIMO Doherty PA corresponding was implemented based on electronic design automation (EDA) simulation. Simulation results demonstrate very high power added efficiencies at both saturation and superior back-off regions in ~13.5 dB range. It amplifies identical inputs and gives equal information streams into two outputs. By sharing the output of the common Doherty core equally with two private peaking amplifiers, classic 3-way Doherty operation is preserved. Only FOUR discrete devices are required instead of SIX in traditional design approach. Because of the reduction of active component number and the affiliated circuitry, the present disclosure based MIMO Doherty PA is more compact, powerful and cost-effective.

With the embodiment of the present disclosure, higher saving ratio and better channel performance (output power, linearity, efficiency, power gain etc.) consistency would be greatly improved.

A Second Embodiment

A method for turning on a multi-channel Doherty power amplifier is provided in this embodiment. The method is implemented at a transmitter side, the multi-channel Doherty power amplifier includes multiple private peaking amplifiers and a common Doherty core, the common Doherty core includes one common carrier amplifier and at least one common peaking amplifier. As the structure and the functions of the multi-channel Doherty power amplifier have been described in the first embodiment, the same contents as those in the first embodiment are omitted.

In this embodiment, the common carrier amplifier and at least one common peaking amplifier are connected in parallel, that is, the multi-channel Doherty power amplifier is in a parallel type architecture. For example, when the multi-channel Doherty power amplifier is implemented in MIMO system, the multi-channel Doherty power amplifier is a parallel type MIMO Doherty PA.

FIG. 14 shows a diagram of the method for turning on a multi-channel Doherty power amplifier in accordance with an embodiment of the present disclosure, as shown in FIG. 14, the method 1400 includes:

Block 1401, the common carrier amplifier is turned on until an input power level reaches a predetermined threshold.

Block 1402, the multiple private peaking amplifiers are turned on in a proper sequence until all the private peaking amplifiers are on.

Block 1403, the at least one common peaking amplifier is turned on in a proper sequence until all the common peaking amplifier are on.

Figure 15:
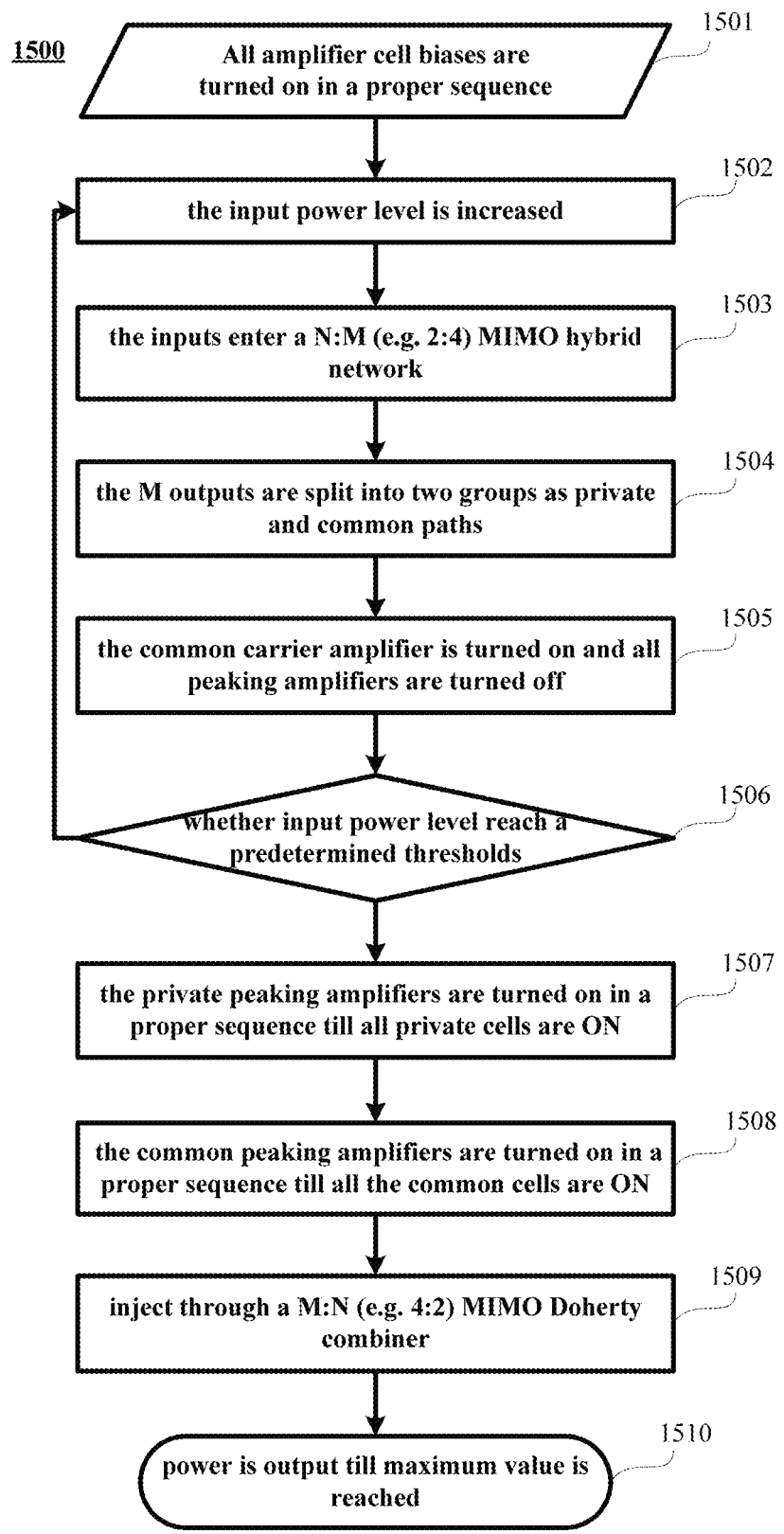
FIG. 15 shows another diagram of the method for turning on a multi-channel Doherty power amplifier of the second embodiment of the present disclosure.

FIG. 15 shows another diagram of the method for turning on a multi-channel Doherty power amplifier in accordance with an embodiment of the present disclosure, as shown in FIG. 15, the method 1500 includes:

Block 1501, biases of all amplifiers are turned on in a proper sequence.

Block 1502, the input power level is increased.

Block 1503, the inputs enter a N:M (e.g. 2:4) MIMO hybrid network.

Block 1504, the M outputs are split into two groups as private and common paths.

Block 1505, the common carrier amplifier is turned on and all peaking amplifiers are turned off.

Block 1506, whether input power level reaches a first predetermined thresholds is judged.

Block 1507, the private peaking amplifiers are turned on in a proper sequence till all private amplifiers are ON.

Block 1508, the common peaking amplifiers are turned on in a proper sequence till all the common cells are ON.

Block 1509, inject through an M:N (e.g. 4:2) MIMO Doherty combiner.

Block 1510, power is output till maximum value is reached.

As illustrated in FIG. 15, in the low power region, with the proper input splitting scheme, only the common carrier amplifier operates and its output is split into two output terminals equally, as shown in FIG. 6. With an increase of input power level greater than a predetermined threshold value, the private peaking amplifiers are turned on in a proper sequence till the increased input power reaches a threshold level. Then, the common peaking amplifier starts operating till the overall MIMO Doherty PA reaches its maximum output power designed.

This sequence arrangement is useful to guarantee minor efficiency dropping effects between peak efficiency points and superior and smooth power gain characteristics facilitating digital pre-distortion (DPD) linearization scheme, as observed in FIG. 11.

As can be seen from the above embodiment, the common carrier amplifier and the common peaking amplifier sharing among private peaking amplifiers help suppress the detrimental efficiency degradation caused by the current unbalance between sub-amplifiers in MIMO, characteristic impedances of the load modulation network are optimized by the load modulation tuning element which is capable of narrowing or broadening the Doherty region range and trading off output power and efficiency. The current unbalance caused by component variations for each channel could be compensated by using different values of channel mismatch tuning elements. It fine tunes the channel current balance for better MIMO performance from system perspective.

A Third Embodiment

A multi-antenna transmitter is provided in this embodiment, and the same contents as those in the first and the second embodiments are omitted.

Figure 16:
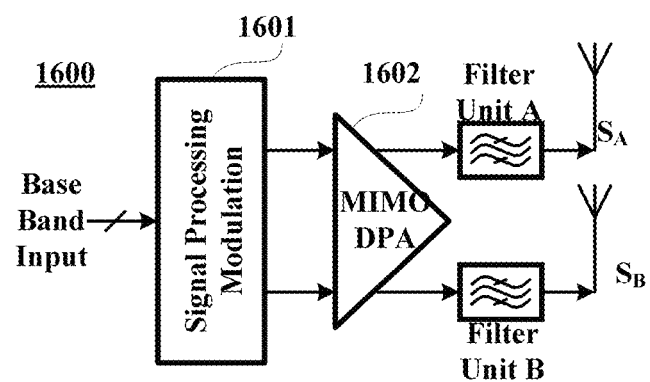
FIG. 16 shows a diagram of a transmitter of the third embodiment of the present disclosure.

FIG. 16 shows a diagram of the multi-antenna transmitter 1600, as shown in FIG. 16, the multi-antenna transmitter includes a signal processor 1601 and a multi-channel Doherty power amplifier 1602.

In this embodiment, the signal processor 1601 is configured to perform signal processing on base band input signals of multiple channels. The prior art may be refereed to for the implementation of the signal processor 1601, which will not be described herein.

In this embodiment, the multi-channel Doherty power amplifier 1602 is configured to amplify identical multi-channel signal for multiple inputs and multiple outputs. As the structure, functions, and advantages have been described in the first embodiment, the contents of which are incorporated herein, and shall not be described herein any further.

In an implementation of this embodiment, the multi-channel Doherty power amplifier 1602 may include multiple two-stage Doherty power amplifier, each two-stage Doherty power amplifier includes two private peaking amplifiers and a common Doherty core, the common Doherty core includes one common carrier amplifier and one common peaking amplifier.

As can be seen from the above embodiment, it was verified and superior to provide ~13.5 dB or more output power back off for Doherty operation compared to a value of 6 dB or a value of 9 dB in prior art. It is a quite compact structure by reducing the transistor number used with a rate of 33%, which is greater than a 25% saving compared to prior art. It also facilities reductions of BOM cost, power consumption, PCB area, equipment size/volume (especially for massive MIMO in 5G applications). It is more consistent on MIMO channel performance e.g. output power, linearity, power gain, which improves MIMO system performance by sharing more active components. More asymmetric Doherty amplifier cells used for common Doherty PA combined with multistage structure (>=3), which could be beneficial for average efficiency enhancement for high PAPR input signal amplification. It is a kind of powerful and flexible Doherty power combination scheme to use for 5G massive MIMO RF PA challenges. It is flexible to fine tune channel mismatching effects caused by fabrication and component variations in private peaking amplifiers. The active load modulation tuning enable better adaptivity for various high-PAPR signal amplifications for high efficiency in easiest design method. It is DPD friendly due to smooth power gain characteristics.

A Fourth Embodiment

A terminal device is provided in this embodiment.

In this embodiment, the terminal device includes the multi-antenna transmitter 1600 of the third embodiment. As the structure, functions, and advantages of the multi-antenna transmitter 1600 have been described in the first to third embodiments, the contents of which are incorporated herein, and shall not be described herein any further.

A Fifth Embodiment

A network device is provided in this embodiment.

In this embodiment, the network device includes the multi-antenna transmitter 1600 of the third embodiment. As the structure, functions, and advantages of the multi-antenna transmitter 1600 have been described in the first to third embodiments, the contents of which are incorporated herein, and shall not be described herein any further.

A Sixth Embodiment

A communication system is provided in this embodiment.

In this embodiment, the system includes a network device and at least one terminal device, the terminal device can be achieved by terminal device in the fourth embodiment, the network device can be achieved by network device in the fifth embodiment, and the same contents as those in the first to fifth embodiments are omitted.

A Seventh Embodiment

A computer program product is provided in this embodiment.

In this embodiment, the computer program product is tangibly stored on a computer readable storage medium and comprising instructions which, when executed on a processor of a multi-antenna transmitter, cause the multi-antenna transmitter to perform a method for turning on a multi-channel Doherty power amplifier according to the second embodiment.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. The machine readable medium may include but not limited to an electronic, magnetic, optical, electromagnetic, infrared, or semiconductor system, apparatus, or device, or any suitable combination of the foregoing.

More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above Rather, the specific features and acts described above are disclosed as example forms of implementing the claims.

What is claimed is:

1. A multi-channel Doherty power amplifier, comprising:
    multiple input ports and a same number of output ports corresponding to multiple channels;
    multiple channel specific peaking amplifiers corresponding to the multiple channels; and
    a common Doherty core shared by the multiple channel specific peaking amplifiers, wherein the common Doherty core comprises one common carrier amplifier and at least one common peaking amplifier;
    wherein, the multiple channel specific peaking amplifiers and the common Doherty core are configured to amplify identical multi-channel signal for multiple inputs and multiple outputs.

2. A method for turning on a multi-channel Doherty power amplifier, the multi-channel Doherty power amplifier comprises multiple channel specific peaking amplifiers and a common Doherty core, the common Doherty core comprises one common carrier amplifier and at least one common peaking amplifier, wherein the method comprising:
    turning on the common carrier amplifier until an input power level reaches a predetermined threshold;
    turning on the multiple channel specific peaking amplifiers in a proper sequence for the multiple channel specific peaking amplifiers until all the channel specific peaking amplifiers are on; and
    turning on the at least one common peaking amplifier in a proper sequence for the at least one common peaking amplifier until all the at least one common peaking amplifier are on.

3. The multi-channel Doherty power amplifier according to claim 1, wherein the common carrier amplifier and the at least one common peaking amplifier are connected in parallel, and the turning on of the channel specific peaking amplifiers is earlier than that of the at least one common peaking amplifier.

4. The multi-channel Doherty power amplifier according to claim 1, wherein the common carrier amplifier and the at least one common peaking amplifier are connected in serial, and the turning on of the channel specific peaking amplifiers is later than that of the at least one common peaking amplifier.

5. The multi-channel Doherty power amplifier according to claim 1, wherein the multi-channel Doherty power amplifier further comprising:
    a power divider, configured to split input signals of the multiple channels into input signals of the multiple channel specific peaking amplifiers and the common Doherty core.

6. The multi-channel Doherty power amplifier according to claim 5, wherein the power divider comprises at least two quadrature hybrid couplers, and they are symmetrical structure for the multi-channel signal splitting.

7. The multi-channel Doherty power amplifier according to claim 1, wherein the multi-channel Doherty power amplifier further comprising:
    a Doherty combiner, configured to combine output signals of the multiple channel specific peaking amplifiers and the common Doherty core and output signals corresponding to the multiple channels.

8. The multi-channel Doherty power amplifier according to claim 7, wherein the Doherty combiner comprises:

a multistage Doherty combiner, configured to combine output signals of the common Doherty core;

a splitting node, configured to split the combined output signal and output signals corresponding to the multiple channels symmetrically;

multiple channel summing nodes, configured to sum respectively combined output signal corresponding to each channel and output signal feeding forward by the splitting node; and multiple real-to-real impedance transformers, configured to terminate respectively load for each channel and output signal corresponding to each channel.

9. The multi-channel Doherty power amplifier according to claim 8, wherein the Doherty combiner further comprises:

multiple channel peaking combiners, configured to combine output signals of multiple channel specific peaking amplifiers.

10. The multi-channel Doherty power amplifier according to claim 1, wherein the multi-channel Doherty power amplifier further comprising:

multiple channel mismatch tuners corresponding to the multiple channel specific peaking amplifiers, configured to compensate mismatch among the multiple channels.

11. The multi-channel Doherty power amplifier according to claim 1, wherein the multi-channel Doherty power amplifier further comprising:

a load modulation tuner, configured to adjust the load modulation behavior by influencing the impedance value of a common node.

12. The multi-channel Doherty power amplifier according to claim 1, wherein the topology of the common Doherty core comprises any one of the following: normal Doherty, inverted Doherty, even Doherty, uneven Doherty, symmetric Doherty, asymmetric Doherty, parallel type Doherty, serial type Doherty, multistage Doherty, or multi-way Doherty.

13. A multi-antenna transmitter, comprising:

a signal processor, configured to perform signal processing on base band input signals of multiple channels; and a multi-channel Doherty power amplifier comprising:
multiple input ports and a same number of output ports corresponding to multiple channels,
multiple channel specific peaking amplifiers corresponding to the multiple channels, and
a common Doherty core shared by the multiple channel specific peaking amplifiers, wherein the common Doherty core comprises one common carrier amplifier and at least one common peaking amplifier;

wherein, the multiple channel specific peaking amplifiers and the common Doherty core are configured to amplify identical multi-channel signal for multiple inputs and multiple outputs.

14. The multi-antenna transmitter according to claim 13, wherein the multi-channel Doherty power amplifier comprises multiple two-stage Doherty power amplifier, each two-stage Doherty power amplifier comprises two channel specific peaking amplifiers and a common Doherty core.

* * * * *